(12) United States Patent
Assmann et al.

(10) Patent No.: US 10,331,036 B2
(45) Date of Patent: Jun. 25, 2019

(54) EXPOSURE MASK, EXPOSURE APPARATUS AND METHOD FOR CALIBRATING AN EXPOSURE APPARATUS

(71) Applicant: Infineon Technologies AG, Neubiberg (DE)

(72) Inventors: Heiko Assmann, Dresden (DE); Markus Dankelmann, Wachau (DE); Uwe Winkler, Neustadt (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 4 days.

(21) Appl. No.: 15/595,987

(22) Filed: May 16, 2017

(65) Prior Publication Data

US 2017/0336718 A1 Nov. 23, 2017

(30) Foreign Application Priority Data

May 18, 2016 (DE) .......................... 10 2016 109 099

(51) Int. Cl.
*G03B 27/42* (2006.01)
*G03B 27/54* (2006.01)
*G03F 7/20* (2006.01)
*G03F 1/22* (2012.01)
*G03F 1/44* (2012.01)
*G03F 9/00* (2006.01)

(52) U.S. Cl.
CPC .......... *G03F 7/70058* (2013.01); *G03F 1/22* (2013.01); *G03F 1/44* (2013.01); *G03F 7/70641* (2013.01); *G03F 7/70683* (2013.01); *G03F 9/7026* (2013.01)

(58) Field of Classification Search
CPC .......... G03F 1/22; G03F 7/70058; G03F 1/24; G03F 7/70633; G03F 7/0625; G03F 7/20; G03F 7/70283; G03F 7/70733; G03F 1/20; G03F 1/64; G03F 1/72; G03F 1/36; G03F 1/38; G03F 1/76; G03F 1/26; G03F 1/54; G03F 1/58; G03F 2007/2067; G03F 2009/005; G03F 1/70; G03F 1/50; G03F 7/0002; G03F 1/30; G03F 7/2022; G03F 7/00
See application file for complete search history.

(56) References Cited

U.S. PATENT DOCUMENTS 6,692,875 B2 * 2/2004 Fischer .................... G03F 1/30
430/22
2001/0022691 A1 9/2001 Furter et al.
2002/0030800 A1 3/2002 Nellissen
2002/0127480 A1 9/2002 Mathuni et al.
(Continued)

FOREIGN PATENT DOCUMENTS

DE  10005189 A1  8/2001
DE  10206188 A1  9/2002
DE  102004062228 A1  7/2005
(Continued)

*Primary Examiner* — Mesfin T Asfaw
(74) *Attorney, Agent, or Firm* — Viering, Jentschura & Partner mbB (57) ABSTRACT

In various embodiments, an exposure mask may include a carrier, a first exposure structure in a first structure plane of the carrier, and a second exposure structure in a second structure plane of the carrier. The two structure planes differ from one another.

17 Claims, 7 Drawing Sheets

(56) References Cited

U.S. PATENT DOCUMENTS

2005/0140952 A1    6/2005  Park et al.
2014/0231970 A1*   8/2014  Schneider ................ G03F 1/00
                                                           257/657

FOREIGN PATENT DOCUMENTS

DE      102004003341 A1    8/2005
WO         03054627 A2     7/2003

* cited by examiner

EXPOSURE MASK, EXPOSURE APPARATUS AND METHOD FOR CALIBRATING AN EXPOSURE APPARATUS

CROSS-REFERENCE TO RELATED APPLICATION

This application claims priority to German Patent Application Serial No. 10 2016 109 099.9, which was filed May 18, 2016, and is incorporated herein by reference in its entirety.

TECHNICAL FIELD

Various embodiments relate generally to an exposure mask, an exposure apparatus and a method for calibrating an exposure apparatus.

BACKGROUND

In the semiconductor industry, even complex integrated circuits are produced by means of basic processes, wherein many of the processes are geared to producing local structures on a wafer or any other suitable support. To that end, it is conventional practice for part of the wafer to be covered with a structured photoresist (referred to e.g. as soft mask) or some other structured material (referred to e.g. as hard mask). These structured layers are conventionally produced photolithographically, i.e. by means of an exposure process in which a pattern of an exposure mask is imaged onto a light-sensitive layer, e.g. a photoresist layer, or onto some other suitable layer.

Exposure processes have been established for a long time, and there are a large number of variations, e.g. with regard to the section-by-section exposure of a wafer by means of a so-called stepper, with regard to the wavelength used (e.g. UV light or deep UV light with a wavelength of less than 300 nm), etc.

The photoresist layer is correspondingly developed after the partial exposure. In this case, the photoresist layer is partly removed, such that this can be used as a structured masking layer. By means of this masking layer, a layer to be treated (e.g. a wafer to be treated or a layer to be treated on a wafer) arranged below the masking layer can be locally altered, e.g. doped, removed (e.g. by means of etching), etc. Furthermore, it is also possible for further layers to be grown locally by means of the masking layer, e.g. by means of a so-called lift-off process or the like.

The exposure masks used for the exposure of a light-sensitive layer usually consist of a transparent carrier, on the surface of which a pattern (i.e. at least one exposure structure) of non-transparent or less transparent regions, for example composed of chromium, is produced. During the exposure of a light-sensitive layer, the pattern of the exposure mask is imaged onto the light-sensitive layer by means of an exposure apparatus. To that end, the light-sensitive layer is positioned with respect to the imaging optical unit of the exposure apparatus (that is to say that a predefined exposure geometry is set) in such a way that the pattern of the exposure mask is imaged onto the light-sensitive layer in as focused a manner as possible, that is to say that the light-sensitive layer is positioned in accordance with the image distance b, which results from the object distance g and the focal length f of the optical unit. The relationship is essentially described by means of the imaging equation:

$$\frac{1}{f} = \frac{1}{b} + \frac{1}{g}.$$

In order to ensure an optimum quality of the exposure, it is conventional practice to use a test wafer for reference exposures, wherein different test regions of the test wafer are exposed using different exposure geometries. By way of example, the distance between the test wafer and the imaging optical unit (for example a lens arrangement or a mirror arrangement) of the exposure apparatus is varied during the exposure of the test regions of the test wafer. By means of the evaluation of the test wafer, it is then possible to determine the optimum exposure geometry for the exposure of further wafers. However, this is time- and cost-intensive. Furthermore, after the exposure of a plurality of wafers, demonstrating whether the respective wafers were exposed correctly, e.g. at the optimum focus, is possible only with comparative difficulty.

SUMMARY

In various embodiments, an exposure mask may include a carrier, a first exposure structure in a first structure plane of the carrier, and a second exposure structure in a second structure plane of the carrier. The two structure planes differ from one another.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In accordance with various embodiments, an exposure mask is described, which is also referred to as reticle, for use with an illumination system (e.g. for transmitted-light illumination) in microlithography.

The exposure mask described herein enables the exposure geometry, e.g. the focus, to be determined more simply and more rapidly.

It is conventional practice to carry out a focus variation of entire test exposure series in order to determine an optimum focal point for the exposure of wafers, for example, wherein to that end a change in the distance between imaging optical unit and wafer surface is produced by means of moving the wafer stage (i.e. a positioning system for positioning the carrier to be exposed relative to the imaging optical unit). The change in focus also affects the structures produced by means of the exposure in the chip; therefore, the wafer must at all events undergo rework or repair if the exposure was not carried out at the optimum focus or in the predefined focal range.

In accordance with various embodiments, a description is given of a method for inline determination and for ongoing process control of the product focus in photolithography.

It is generally necessary, depending on the photoresist used, the constitution of the wafer surface and/or the constitution of the structures to be produced for the individual lithographic plane, to determine and regularly control in each case the focus setting to be used (in the region of the reducing projection lithography). With an improper focus setting, structure defects can occur, the effects of which can lead from an increase in defect density through a loss of yield to reliability problems.

Conventionally it may be necessary to determine the focus setting to be used experimentally by means of staggered focus variations during the exposure of a matrix test wafer and subsequent metrological evaluation of the matrix test wafer. Even in ongoing production operation, the focus setting respectively used had to be controlled in the same way, wherein the ongoing production operation had to be halted for the exposure of the matrix test wafer.

This may have the effect that in conventional methods, on account of the batch logistics used in process operation, a batch stoppage may be necessary and, associated therewith, a lengthening of the throughput time has to be accepted. On account of the batch logistics, splitting off an experimental wafer (i.e. a matrix test wafer) and setting up and carrying out the experimental staggered exposure require manual intervention in the operation of the respective process installation. In the conventional methods, there also arises the additional outlay of an additional structure width measurement on the staggered wafer with special formulation, wherein the staggered exposure has to be removed after measurement and evaluation (rework) and a standard processing then has to be carried out. In this case, the master batch has to wait during the entire time, such that the throughput time for the batch is lengthened.

In a focus stagger exposure conventionally used, a wafer map having rows and columns is used, for example, wherein each column is exposed with a slightly changed focus, which can be achieved by means of a changed distance between the wafer and the imaging optical unit (the step size can be 0.10 μm, for example).

The focus stagger exposure can be evaluated by means of the so-called Bossung plot. In this case, by way of example, the structure width of focus-sensitive structures is plotted against the focus used. In general, a focus-sensitive structure is produced by means of exposing an exposure mask, wherein the exposure mask includes corresponding focus-sensitive exposure structures (also referred to as focus-sensitive patterns). By way of example, line patterns, patterns of rhombi, trench patterns, patterns of holes or other suitable focus-sensitive patterns can be used as focus-sensitive exposure structures. If the structure width of a focus-sensitive structure, e.g. plotted in a Bossung plot, assumes an extremum, the optimum focus value is attained. By way of example, by means of a line pattern it is possible to produce a line structure whose line width, e.g. plotted in a Bossung plot, assumes a maximum value if the optimum focus value is attained. Furthermore, by means of exposing a trench pattern, it is possible to produce a trench structure whose trench width, e.g. plotted in a Bossung plot, assumes a minimum value if the optimum focus value is attained.

By way of example, it is possible to determine the optimum distance between the wafer to be exposed and the imaging optical unit of the exposure apparatus.

In accordance with various embodiments, with each exposure of productive structures in the unproductive region, e.g. between the chips or in the sawing frame, even without variation of the focus value set, a staggered focus variation can automatically be concomitantly exposed. During the subsequent automatic, productive quality control (e.g. a CD measurement, denoting critical dimension, CD), the staggered focus variation can then likewise be automatically measured and evaluated.

Consequently, the focus data for each individual exposure run are always available. Furthermore, it enables a reduction of batch throughput times by avoidance of additional batch logistics and the avoidance of additional lithographic rework.

By way of example, for a new reticle set in the case of certain technologies up to ten or more than ten focus determinations for critical planes per exposure installation are incurred, which can be significantly shortened with the exposure mask described herein and/or the method described herein. In this regard, in accordance with various embodiments, it would be possible to shorten the throughput time for customers' patterns by at least 30 hours.

Various embodiments are based on using a topographical staircase on the photomask (i.e. the exposure mask or on the reticle). In this case, focus-sensitive structures are present on each step of the topographical staircase and are projected onto the wafer with a different focus in each case on account of the different step heights and a photoresist (or some other light-sensitive layer) on the wafer is correspondingly exposed.

In the unproductive chip region (e.g. in the sawing frame), the exposure structures and/or reference exposure structures (e.g. the focus-sensitive structures on the steps of the topographical staircase) described herein are concomitantly exposed simultaneously with the product structures and can thus be available in each individual exposure run.

Figure 1:
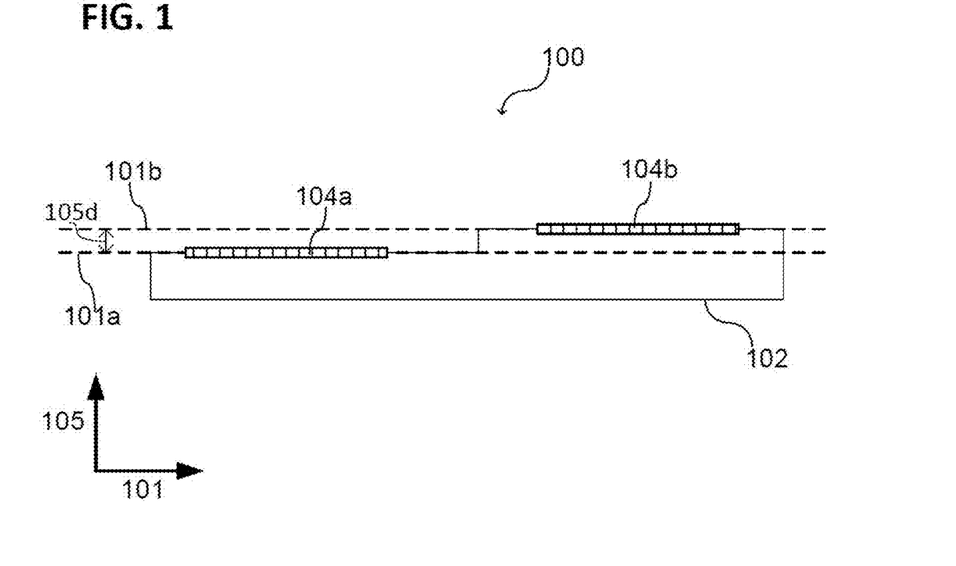
FIG. 1 shows an exposure mask in a schematic side view or cross-sectional view, in accordance with various embodiments.

FIG. 1 illustrates an exposure mask 100 in a schematic side view or cross-sectional view, in accordance with various embodiments. The exposure mask 100 includes a carrier 102. For use as an exposure mask 100, the carrier 102 is transparent to the electromagnetic spectrum respectively used for the exposure, e.g. in the ultraviolet (UV) range of light. By way of example, the carrier 102 can be produced from a UV-transmissive glass (e.g. quartz glass). Alternatively, some other suitable material can be used as carrier 102.

In accordance with various embodiments, the carrier 102 is embodied in such a way that it includes at least one first structure plane 101a and a second structure plane 101b. In this case, a first exposure structure 104a is arranged in the first structure plane 101a and a second exposure structure 104b is arranged in the second structure plane 101b.

The carrier 102 can be embodied in such a way that the two structure planes 101a, 101b are aligned parallel to one another and are arranged at a distance 105d from one another, as is illustrated for example in FIG. 1.

The distance 105d between the two structure planes 101a, 101b can for example be greater than approximately 100 nm, or approximately 250 nm, or greater than approximately 500 nm. The distance 105d between the two structure planes 101a, 101b can cause a different image distance during an exposure process using such an exposure mask 100 for the first exposure structure 104a and the second exposure structure 104b on account of a different object distance. Consequently, the two exposure structures 104a, 104b are not imaged simultaneously with an optimum focus on a substrate to be exposed. From the known distance 105d, i.e. a variation $\Delta g$ of the object distance g, it is possible to computationally deduce a focal point or a focal plane (i.e. an optimum image distance b).

If, by way of example, the first exposure structure 104a is intended to be imaged with an optimum focus on a substrate, but the second exposure structure 104b was actually imaged with an optimum focus on the substrate, the position of the substrate must be adapted, e.g. depending on the magnification factor M=g/b by the value $\Delta g/M^2$, in order that as a result the first exposure structure 104a is imaged with an optimum focus.

Between the change in image distance $\Delta b$ and the change in the object distance $\Delta g$, on the basis of the imaging equation the following relationship arises: $\Delta g = M^2 \cdot \Delta b$, wherein M is the magnification factor g/b.

In accordance with various embodiments, the carrier 102 can analogously include more than two structure plane, e.g. three, four, five, six, seven, eight, nine, ten or more than ten. By means of the number of structure planes and the respective distance between the different structure planes, it is possible to stipulate how accurately the information concerning the focal point of the exposure mask 100 can be determined. In this case, it is necessary to take account of the magnification factor, which, for a predefined focus variation, generally necessitates a greater variation of the object distance (i.e. of the distance 105d). It goes without saying that at least one exposure structure is provided in each structure plane.

In accordance with various embodiments, the respective exposure structure 104a, 104b can be embodied in such a way that structures which are focus-sensitive are imaged on the substrate to be exposed.

The respective exposure structure 104a, 104b may include for example a line pattern or else various other focus-sensitive patterns. The focus-sensitive pattern can have for example an exposure structure width, e.g. the spacing of two adjacent lines or the width of the respective lines, holes, trenches, etc., in a range of approximately 0.3 μm to approximately 10 μm, e.g. in a range of approximately 1 μm to approximately 3 μm.

The respective exposure structure 104a, 104b may include or essentially consist of a light-reflecting material, e.g. a metal such as chromium or platinum. In accordance with various embodiments, the respective exposure structure 104a, 104b can itself be produced by means of a photolithographic method. By way of example, a metal layer applied on the carrier 102 can be partly removed, e.g. by means of a structured etching mask and an etching process.

Figure 2:
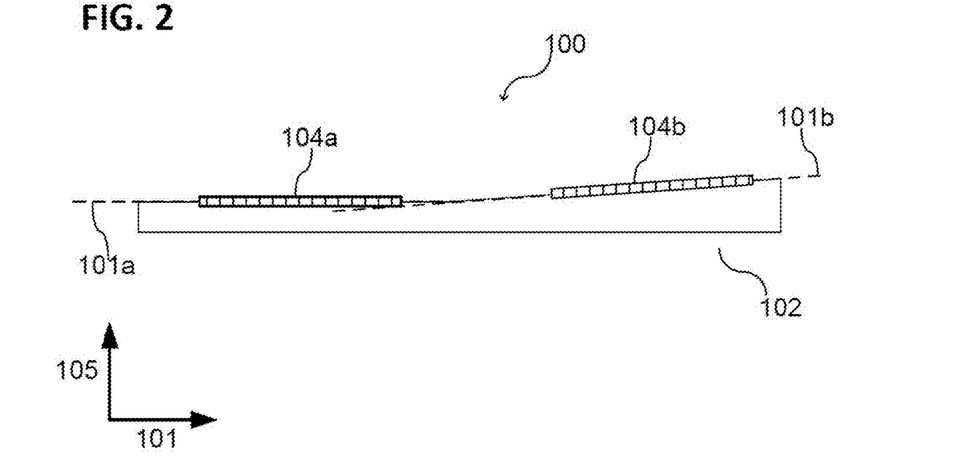
FIG. 2 shows an exposure mask in a schematic side view or cross-sectional view, in accordance with various embodiments.

As is illustrated in FIG. 2, as an alternative to the manner described in FIG. 1 the carrier 102 can be embodied in such a way that the two structure planes 101a, 101b are arranged at an angle to one another. One or a plurality of exposure structures 104b can analogously be provided in the second structure plane 101b.

Figure 3:
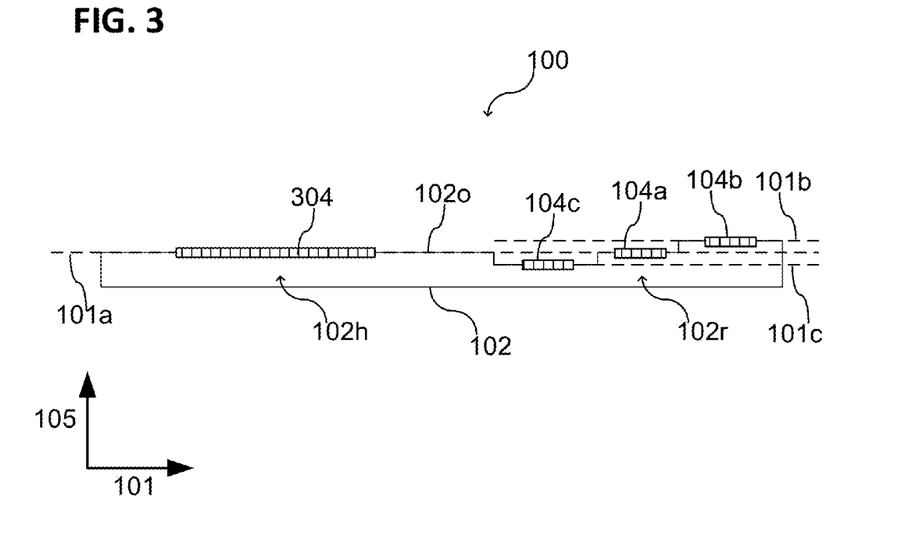
FIG. 3 shows an exposure mask in a schematic side view or cross-sectional view, in accordance with various embodiments.

FIG. 3 illustrates an exposure mask 100 in a schematic side view or cross-sectional view, in accordance with various embodiments. The exposure mask 100 illustrated in FIG. 3 can be embodied as described above. The transparent carrier 102 can have a planar surface 102o, wherein the structure planes 101a, 101b, 101c lie parallel to the planar surface 102o. The planar surface 102o can be or define the first structure plane 101a.

As is illustrated in FIG. 3, the exposure mask 100 may include the following: a transparent carrier 102 as described above; a main exposure structure 304 arranged in a principal plane 101a of the transparent carrier 102; and a plurality of reference exposure structures 104a, 104b, 104c, wherein at least one first reference exposure structure 104a of the reference exposure structures 104a, 104b, 104c is arranged in the principal plane 101a and wherein at least one second reference exposure structure 104b, 104c of the reference exposure structures 104a, 104b, 104c is arranged at a distance from the principal plane 101a.

Illustratively, by means of the reference exposure structures 104a, 104b, 104c, it is possible to determine or check whether the principal plane 101a of the transparent carrier 102 is optimally imaged during exposure. It is thus possible to achieve the situation that, or to check whether, the main exposure structure 304 is optimally imaged onto a substrate during exposure.

The main exposure structure 304 may include the product structure 304 that is intended to be produced by means of the exposure mask 100. The product structure 304 can be arranged in the product structure plane 101a. For the sake of simplicity, the product structure plane 101a is a planar surface 102o of the transparent carrier 102. Illustratively, the carrier 102 can be provided in plate form or sheet form with at least one planar principal plane 101a. The main exposure structure 304 and the reference exposure structures 104a, 104b, 104c can be provided on the same side of the carrier 102.

In accordance with various embodiments, at least one reference exposure structure 104c of the reference exposure structures 104a, 104b, 104c can be arranged below the principal plane 101a in the transparent carrier 102. Furthermore, at least one reference exposure structure 104b of the reference exposure structures 104a, 104b, 104c can be arranged above the principal planet 101a on the transparent carrier 102.

In accordance with various embodiments, the exposure mask 100 may include a product exposure region 102h and a reference exposure region 102r.

As an alternative to the surface 102o of the transparent carrier 102 the product structure plane 101a or the principal plane 101a can be provided at a suitable location of the transparent carrier 102.

Figure 4:
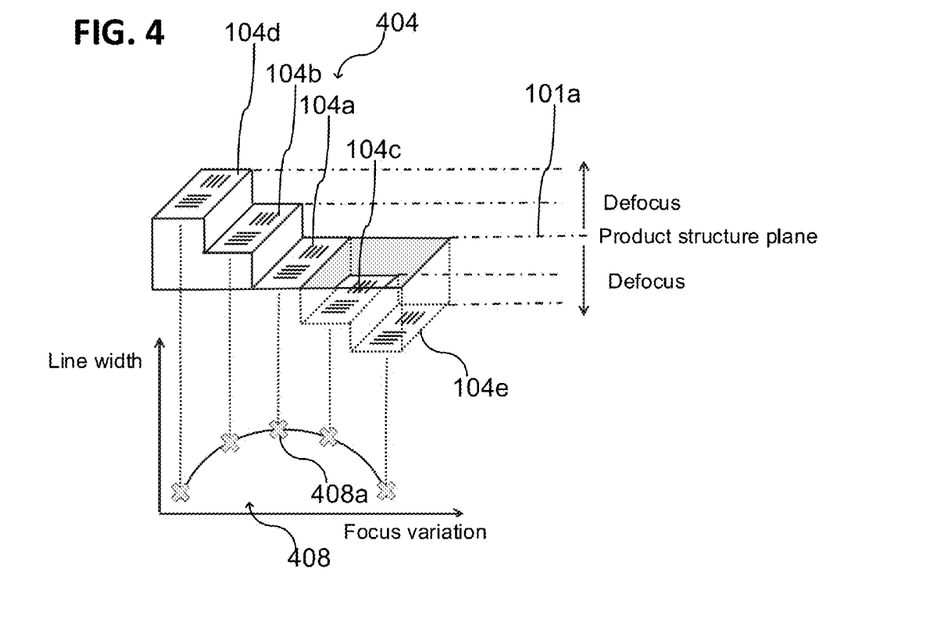
FIG. 4 shows, in a basic schematic diagram, the assignment of the respective line width of the layer structures on the exposed light-sensitive layer to the corresponding exposure structures on the exposure mask and the determination of the optimum focal point by means of the exposure mask, in accordance with various embodiments.

FIG. 4 illustrates a basic schematic diagram for determining or checking the optimum focal point by means of the exposure mask 100, in accordance with various embodiments.

By way of example, the reference exposure structures 404 can be embodied in each case in such a way that the line width of the reference structures 408 produced in each case by means of the reference exposure structures 404 on a substrate (e.g. a wafer or a layer) is dependent on the exposure geometry, i.e. on the position of the focus. Illustratively, the structures produced on a substrate, e.g. by means of exposing and developing a photoresist, differ if the substrate is not at the optimum position during exposure. The line width or the exposure produced by means of the reference exposure structures 404 can be evaluated by means of the Bossung plot, for example.

Ideally, the substrate is positioned in such a way that the product structure plane 101a is optimally imaged on the substrate. In this case, by way of example, the surface to be exposed of the substrate (e.g. a photoresist layer) lies in the corresponding image plane which arises for the product structure 304 in the product structure plane 101a (cf. FIG. 3 and FIG. 5). If this is the case, the reference exposure structure 104a correspondingly arranged in the product structure plane 101a also produces on the exposed substrate a reference structure 408a having an optimum (i.e. maximum) line width. Conversely, if one of the other reference exposure structures 104b, 104c, 104d, 104e produces on the exposed substrate a reference structure having an optimum (i.e. maximum) line width, it can be recognized that the product structure 304 was not optimally imaged. This information can be used for fault finding and/or for sorting out erroneously exposed wafers. Furthermore, this information can be used to improve the position of the substrate in relation to the exposure geometry.

Figure 5:
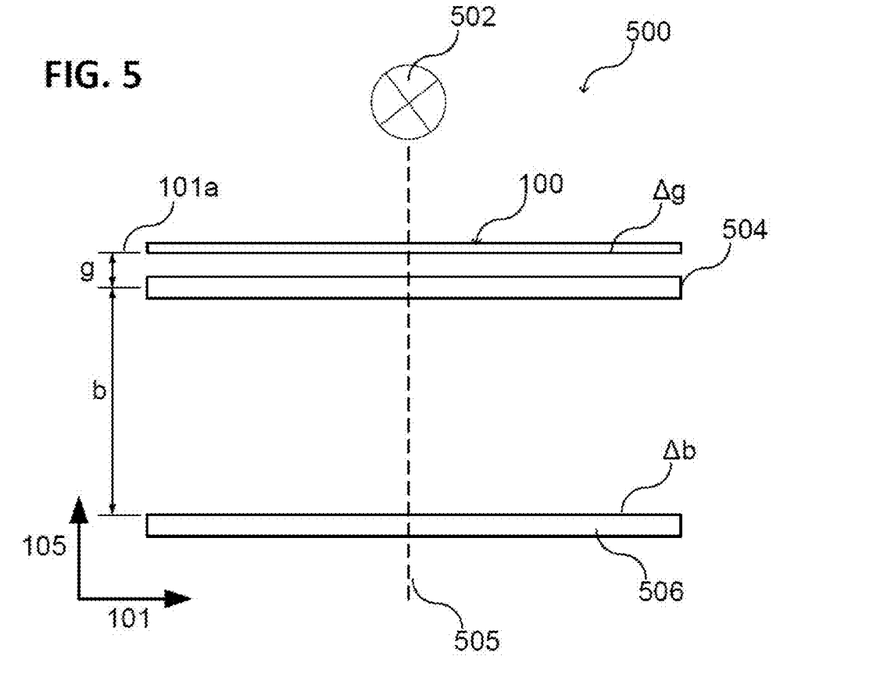
FIG. 5 shows an exposure apparatus in a schematic view, in accordance with various embodiments.

FIG. 5 illustrates an exposure apparatus 500 in a schematic illustration, in accordance with various embodiments. The exposure apparatus 500 is operated by means of the exposure mask 100. In this case, the exposure apparatus 500 may include the following: at least one light source 502; the exposure mask 100 and a lens arrangement 504 or an optical unit 504 (e.g. having one or more lenses or having one or more mirrors). The exposure apparatus 500 can be configured in such a way that a substrate 506 can be exposed by means of the light source 502 and through the exposure mask 100. In this case, the exposure structures of the exposure mask 100 are imaged on the substrate 506, wherein at least one of the reference exposure structures is not imaged optimally since the object distance g of the reference exposure structures varies, $\Delta g$. Accordingly, the image distance b also varies by $\Delta b$ as described above.

The image distance b and the object distance g relate to the optical axis 505. The lens arrangement 504 or the imaging optical unit 504 can have an effective focal length f. The product structure plane 101a can be arranged on the side of the exposure mask 100 which faces the lens arrangement 504 or the optical unit 504. It goes without saying that the principle is illustrated in a greatly simplified manner.

If an exposure mask 100 is used such as is illustrated in FIG. 1, for example, the exposure structures 104a, 104b can have different object distances g relative to the lens arrangement 504 and an optimum (focused) image of the respective exposure structure 104a, 104b can thus be generated at different image distances b.

FIG. 5 illustrates the exposure geometry in such a way that a distance between the substrate 506 and the lens arrangement 504 corresponding to the image distance b is set for the first exposure structure 104a (cf. the exposure mask 100 in accordance with FIG. 1) or for the first reference exposure structure 104a (cf. the exposure mask 100 in accordance with FIG. 3), in which case the second exposure structure 104b (cf. the exposure mask 100 in accordance with FIG. 1) or the second reference exposure structure 104b, 104c (cf. the exposure mask 100 in accordance with FIG. 3) is then correspondingly not imaged at the focus.

A focused imaging or an optimum focus may mean that the exposure geometry is chosen in accordance with the imaging equation, such that the exposure mask 100, the imaging optical unit 504 and the substrate 506 are arranged in accordance with the imaging equation with regard to image distance b and object distance g. If only the substrate 506 is intended to be displaced for altering or adapting the exposure geometry, e.g. in a direction 105 parallel to the optical axis 505, then the position of the substrate 506 is adapted to the image distance b which results for the pattern to be imaged (i.e. the exposure structures on the exposure mask 100). In this case, the aim may be to image the principal plane 101a or the surface 102o of the carrier of the exposure mask 100 in a focused manner. If structures (e.g. exposure structures or e.g. the thickness of a light-sensitive layer on the substrate 506) have a certain extent in the direction 105, the midpoint of these structures relative to the direction 105 can serve as a starting point for describing the exposure geometry.

Figure 6A:
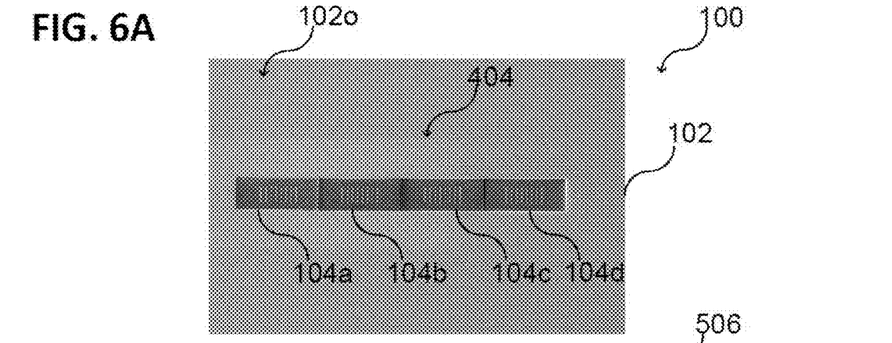
FIGS. 6A and 6B show a plan view of an exposure mask, in accordance with various embodiments, and layer structures of a light-sensitive layer exposed by means of the exposure mask, in accordance with various embodiments.

FIG. 6A illustrates an imaging of the reference exposure structures 404 on a surface 102o of an exposure mask 100, in accordance with various embodiments. In one embodiment, the reference exposure structures 404 can be provided in a stepped fashion in the carrier 102 of the exposure mask 100. The reference exposure structures 404 can each include a plurality of lines, e.g. having a length in a range of approximately 0.3 µm to approximately 20 µm, e.g. having a length of approximately 10 µm.

The respective area of a step, i.e. for example of a structure plane, can be adapted to the size of the respective exposure structure, e.g. have an area in a range of approximately 25 µm² to approximately 1 mm².

The surface 102o of the carrier 102 can be coated with a metal (or some other non-transparent material) directly up to the steps of the exposure structure 404; by way of example, platinum can be deposited onto the surface 102o of the carrier 102, in order to reduce scattered light and to prevent charging during the etching and structuring.

The steps can be etched into the carrier 102. If a step plane 101a of the reference exposure structures 404 is formed by the surface of the carrier 102 itself, this can be incipiently etched minimally in order that the surface roughness and thus the transmission of all the steps are approximately the same.

Alternatively, the steps or generally the reference exposure structures can also be provided on a reference carrier, wherein the latter can then be correspondingly fixed to the product structure exposure mask respectively used for the exposure of a substrate.

By way of example, a quartz glass lamina with a correspondingly etched staircase can be used as reference carrier. The quartz glass lamina can be fixed for example on an exposure mask already present. By way of example, liquid glycerol having a sufficiently high transmission for deep UV light can be used as optical cement.

Figure 6B:
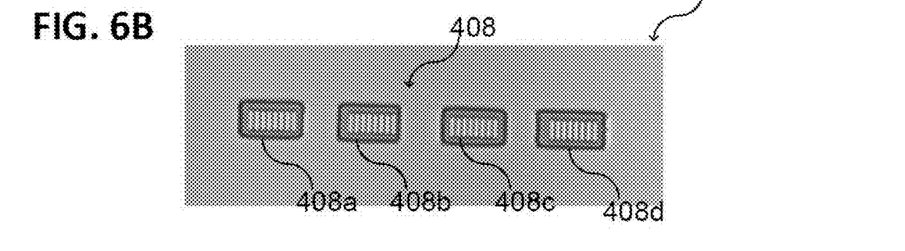

FIG. 6B shows a reference structure 408, which was produced by means of the reference exposure structure 404 on the substrate 506 (e.g. on a wafer). The reference structure 408, in a manner corresponding to the reference exposure structure 404, may include a line structure having a line width, wherein the line width, as described herein, can be used for analyzing the focus.

Exactly one reference structure 408a, 408b, 408c, 408d is assigned to each reference exposure structure 104a, 104b, 104c, 104d and each reference structure 408a, 408b, 408c, 408d is at a different object distance g during exposure. A focus variation can thus be generated (cf. FIG. 4), without the substrate 506 being moved relative to the optical unit 504 of the exposure apparatus 500. The reference structures 408 can be produced in an unused chip region or in the kerf, such that the evaluation of the exposure quality, e.g. of the focus, can be carried out during production.

In order to find an operating point for the exposure apparatus 500, a variation of the focus setting and dose setting can be carried out. By way of example, an irradiation of 280 J/m² can be used, e.g. in a range of approximately 100 J/m² to approximately 500 J/m². For the reference exposure structures 104a, 104b, 104c, 104d, it is possible to use for example an exposure structure width (e.g. a line spacing of adjacent lines) in a range of approximately 0.3 µm to approximately 10 µm, e.g. an exposure structure width of approximately 2 µm.

In accordance with various embodiments, any sufficiently focus-sensitive structure can be used as reference exposure structure 104a, 104b, 104c, 104d for the exposure mask 100.

In accordance with various embodiments, a photoresist layer on the substrate 506 can be exposed. Afterward, the exposed photoresist layer is developed, such that the reference structures 408a, 408b, 408c, 408d are formed in accordance with the exposure. The photoresist can be a positive resist or negative resist.

Figure 7:
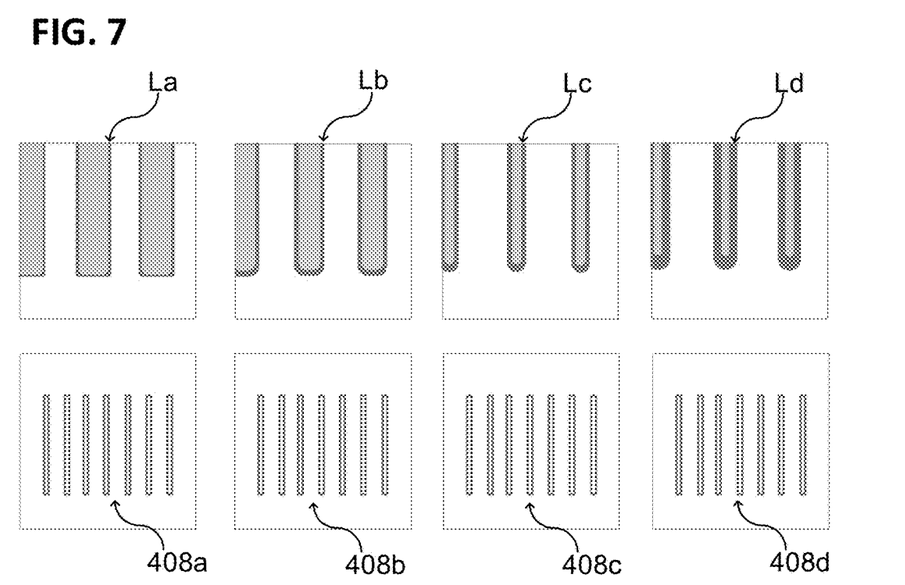
FIG. 7 shows, in a basic schematic diagram, the determination of the line width and the sidewall behavior of the layer structures of a light-sensitive layer exposed by means of the exposure mask, in accordance with various embodiments.

FIG. 7 illustrates a plurality of reference structures 408a, 408b, 408c, 408d produced by means of the exposure mask 100 in a schematic plan view (bottom) and in an enlarged schematic detail view (top). The reference structures 408a, 408b, 408c, 408d produced can be analyzed by means of scanning electron microscopy (SEM), for example. For each of the reference structures 408a, 408b, 408c, 408d, an associated sidewall width $L_a$, $L_b$, $L_c$, $L_d$ can be determined for example on the basis of a micrograph recorded by scanning electron microscopy. Illustratively, the structure quality or the structure accuracy of the reference structures 408a, 408b, 408c, 408d can generally be examined. The optimum reference structure 408 which can be achieved by means of the exposure of the corresponding reference exposure structure 404 can for example also be determined beforehand. In this regard, by means of comparison it is possible to determine directly whether one of the reference structures 408a, 408b, 408c, 408d is optimum or which of the reference structures 408a, 408b, 408c, 408d is optimum; and, if so, it is possible to assign which of the reference exposure structures 104a, 104b, 104c, 104d produced this optimum reference structure.

On the basis of the analysis of the reference structures 408, by way of example, it is possible to position the substrate 506 in such a way (cf. FIG. 5), that the surface 102o of the exposure mask 100 or the product structure plane 101a is imaged in a focused manner.

The sidewall width $L_a$, $L_b$, $L_c$, $L_d$ of the respective reference structure 408a, 408b, 408c, 408d can be determined on the basis of the plan view or on the basis of a cross-sectional view of the respective reference structure 408a, 408b, 408c, 408d. Illustratively, the respective reference structures 408a, 408b, 408c, 408d, if they are not imaged in an optimally focused manner, are trapezoidal in cross section and deviate from a parallelepipedal shape that can be achieved in the ideal case. The deviation from the ideal parallelepipedal shape can be understood as the sidewall width $L_a$, $L_b$, $L_c$, $L_d$. By way of example, the respective sidewall width $L_a$, $L_b$, $L_c$, $L_d$ can be determined from the difference between bottom CD, e.g. measured at the lower interface of the exposed light-sensitive layer (e.g. of the photoresist), and top CD, e.g. measured at the uncovered surface of the exposed light-sensitive layer (e.g. of the photoresist). The sidewall width determined in the plan view passes into a saturation, cf. FIG. 8.

Figure 8:
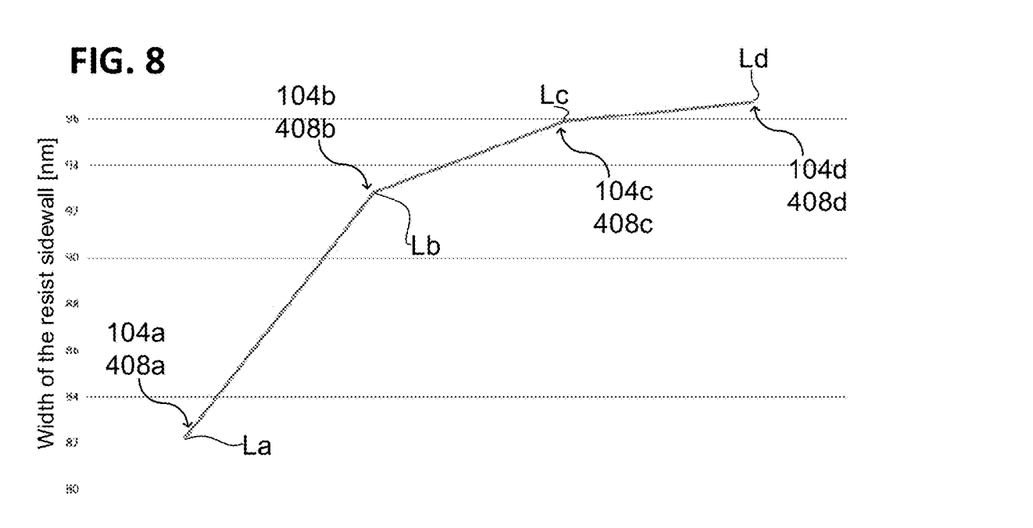
FIG. 8 shows, in a basic schematic diagram, the determination of a sidewall width of the layer structures on the exposed light-sensitive layer and the assignment of the respective sidewall width to the corresponding exposure structures on the exposure mask, in accordance with various embodiments.

The extremum of the bottom CD and the top CD can be determined by means of the Bossung plot. The focus value for this extremum corresponds to the optimum focus value. An exposure of a light-sensitive layer with this focus value can thus have the greatest structure accuracy. In this case, the sidewall width can be minimal.

FIG. 8 illustrates by way of example the width of the sidewall (e.g. of the resist sidewall) of the reference structures 408a, 408b, 408c, 408d produced by means of the respective exposure structures 104a, 104b, 104c, 104d. In this case, the greatest sidewall width $L_d$, i.e. the least accurate imaging, can be assigned to the reference exposure structure 104d. In this case, the smallest sidewall width $L_a$, i.e. the most accurate imaging, can be assigned to the reference exposure structure 104a.

The step height differences of the reference exposure structure 404 (i.e. the distance between respectively adjacent parallel structure planes, are 500 nm in this example. Divided by the square of the imaging scale (in this case, the exposure was carried out using a 5-fold stepper, which corresponds to an imaging scale of 5), a focus difference (i.e. a focus step) of 20 nm per step height difference of the reference exposure structure 404 results at the wafer level.

The focus variation with a small focus difference (e.g. of less than 50 nm) can for example best be determined at the line ends and at the width of the resist sidewall.

In accordance with various embodiments, a focus step of 50 nm can be used at the wafer level, which for example given an imaging scale of a 4-fold reduction corresponds to a glass step (i.e. a step height difference) of 800 nm in each case. The step height difference of the reference exposure structures 404 corresponds to the variation Δg of the object distance g and leads to a corresponding variation Δb of the image distance b, which is described herein as focus variation.

Figure 9:
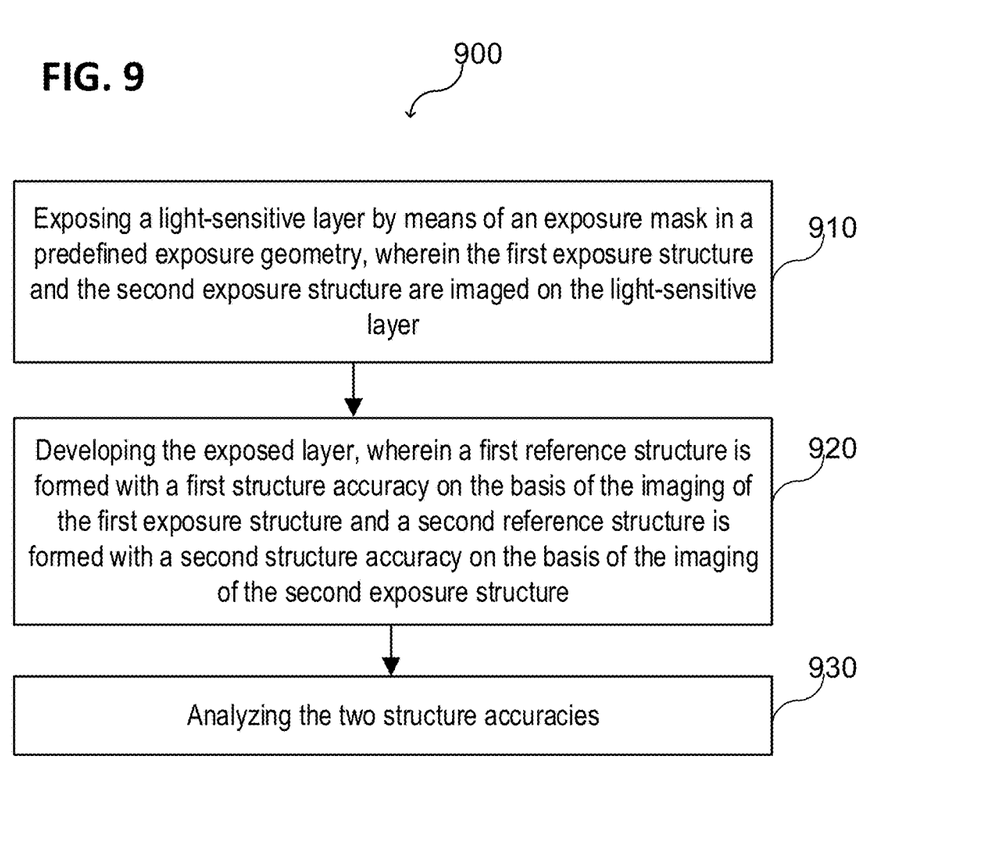
FIG. 9 shows a schematic flow diagram of a method for operating an exposure apparatus, in accordance with various embodiments.

FIG. 9 illustrates a schematic flow diagram of a method 900 for operating an exposure apparatus 500, in accordance with various embodiments. In this case, the method 900 may include at least the following: in 910, exposing a light-sensitive layer by means of an exposure mask 100 (cf. FIG. 1, wherein the exposure mask 100 includes at least one first exposure structure 104a and a second exposure structure 104b) in a predefined exposure geometry, wherein the first exposure structure 104a and the second exposure structure 104b are imaged on the light-sensitive layer; in 920, developing the exposed layer, wherein a first reference structure 408a is formed with a first structure accuracy on the basis of the imaging of the first exposure structure 104a and a second reference structure 408b is formed with a second structure accuracy on the basis of the imaging of the second exposure structure 104b; and in 930, analyzing the two structure accuracies.

Figure 10:
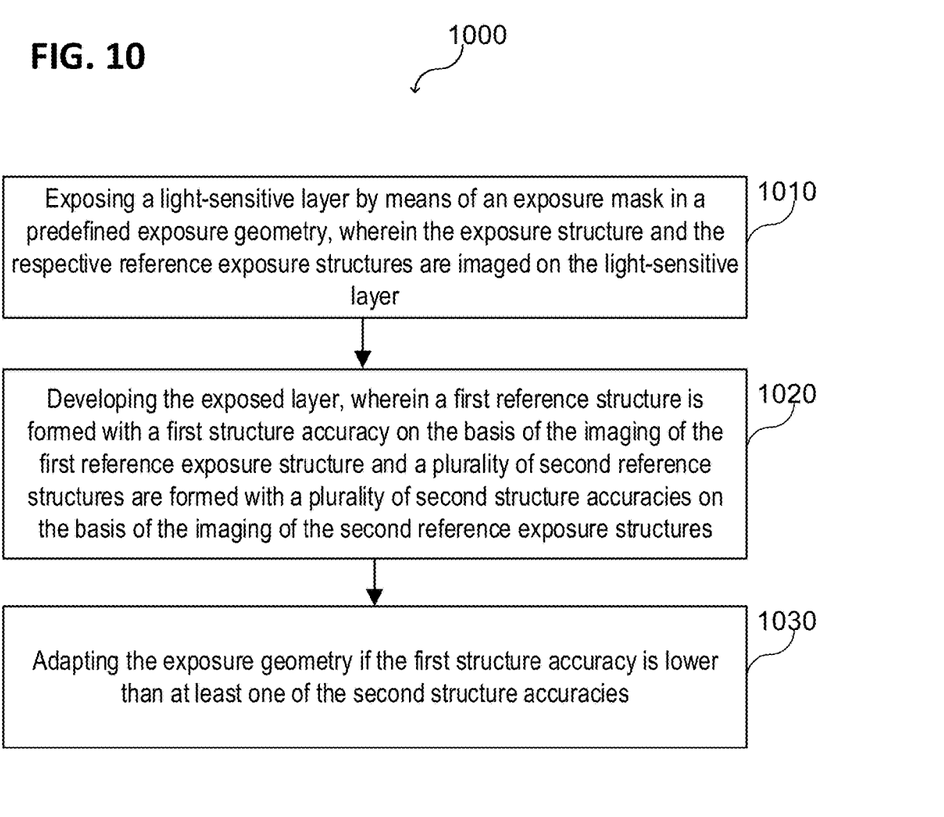
FIG. 10 shows a schematic flow diagram of a method for calibrating an exposure apparatus, in accordance with various embodiments.

FIG. 10 illustrates a schematic flow diagram of a method 1000 for calibrating an exposure apparatus 500, in accordance with various embodiments. In this case, the method 1000 may include at least the following: in 1010, exposing a light-sensitive layer by means of an exposure mask 100 (cf. FIG. 3, wherein the exposure mask 100 includes a (main) exposure structure 304 and a first reference exposure structure 104a and a plurality of second reference exposure structures 104b, 104c) in a predefined exposure geometry, wherein the (main) exposure structure 304 and the respective reference exposure structures 104a, 104b, 104c are imaged on the light-sensitive layer; in 1020, developing the exposed layer, wherein a first reference structure 408a is formed with a first structure accuracy on the basis of the imaging of the first reference exposure structure 104a and a plurality of second reference structures 408b, 408c are formed with a plurality of second structure accuracies on the basis of the imaging of the plurality of second reference exposure structures 104b, 104c; and, in 1030, adapting the exposure geometry if the first structure accuracy is lower than at least one of the second structure accuracies.

Instead of adapting the exposure geometry, the latter can also just be analyzed; by way of example, the method 1000 may include, in 1030, analyzing the first structure accuracy and the second structure accuracies.

Figure 11:
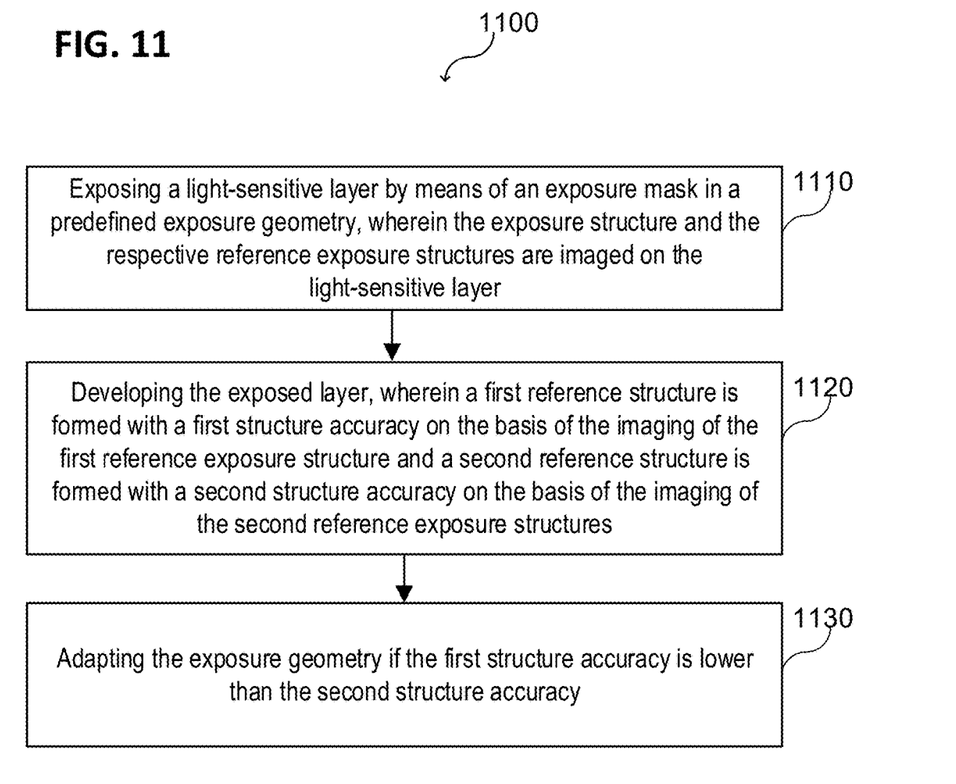
FIG. 11 shows a schematic flow diagram of a method for calibrating an exposure apparatus, in accordance with various embodiments.

FIG. 11 illustrates a schematic flow diagram of a method 1100 for calibrating an exposure apparatus 500, in accordance with various embodiments. In this case, the method 1100 may include at least the following: in 1110, exposing a light-sensitive layer by means of an exposure mask 100 (cf. FIG. 3, wherein the exposure mask 100 includes a (main) exposure structure 304, a first reference exposure structure 104a and a second reference exposure structure 104b) in a predefined exposure geometry, wherein the (main) exposure structure 304 and the respective reference exposure structures 104a, 104b are imaged on the light-sensitive layer; in 1120, developing the exposed layer, wherein a first reference structure 408a is formed with a first structure accuracy on the basis of the imaging of the first reference exposure structure 104a and a second reference structure 408b is formed with a second structure accuracy on the basis of the imaging of the second reference exposure structure 104b; and, in 1130, adapting the exposure geometry if the first structure accuracy is lower than the second structure accuracy.

Instead of adapting the exposure geometry, the latter can also just be analyzed; by way of example, the method 1100 may include, in 1130, analyzing the first structure accuracy and the second structure accuracies.

In accordance with various embodiments, adapting the exposure geometry may include or be the positioning of the layer to be exposed relative to an optical unit 504 of the exposure apparatus 500. By way of example, the positioning can be carried out in such a way that the layer to be exposed is arranged at the image distance b that results from the object distance of the (main) exposure structure 304 (cf. FIG. 5). An exposure in this exposure geometry has the result that the (main) exposure structure 304 is imaged optimally (in a focussed manner). This can be identified or checked for example from the fact that the structure accuracy of the first reference structure 408a is the highest since the corresponding first reference exposure structure 104a is arranged in the same plane (i.e. the principal plane 101a) as the (main) exposure structure 304. The structure accuracies of the further reference structures 404 are then correspondingly lower (cf. FIG. 4).

The features and modes of functioning described herein on the basis of a transmissive exposure mask and a refractive optical unit should be understood analogously for reflective exposure masks as well, e.g. for an EUV exposure using extreme ultraviolet radiation. Reflective exposure masks are used for example in mirror optical units. On account of the short wavelength of less than 15 nm, for example, mirror optical units may be necessary or helpful in an EUV exposure. The carrier described herein can be embodied as a mirror, for example, wherein the exposure structures in this case may include optically absorbent material, e.g. lead, gold, chromium, tantalum nitride or some other suitable material. The carrier can be embodied as a multilayer mirror; by way of example, the carrier may include a plurality of molybdenum/silicon layer pairs arranged one above another.

An exposure mask can also be referred to as a lithography mask. The latter can be used in a lithography installation.

The carrier can be optically transparent and the exposure structures can be optically reflective and/or optically absorbent. Alternatively, the carrier can be optically reflective and the exposure structures can be optically absorbent and/or optically transparent. Since the optical properties are not independent of one another, the respective term transparent, reflective and absorbent can relate to which of the proportions is substantially manifested. By way of example, an optically reflective element can reflect more than 50% of the incident electromagnetic radiation. By way of example, an optically absorbent element can absorb more than 50% of the incident electromagnetic radiation. By way of example, an optically transparent element can be transmissive for more than 50% of the incident electromagnetic radiation. The optical properties can relate to an average value that covers the respective spectrum of the electromagnetic radiation. Alternatively, the optical properties can relate to a reference wavelength.

Various embodiments are based illustratively on using reference structures, which are arranged on the exposure mask, for optimizing the exposure geometry. In this case, the reference structures are arranged on the exposure mask in such a way that they are arranged at different object distances in relation to the optical system of the exposure apparatus during the exposure of a wafer, such that different reference regions of the wafer, which reference regions can be assigned to the reference structures, are exposed with different exposure geometries during an exposure process. On the basis of the quality of the exposure in the reference regions of the wafer, it is then possible to determine, on the basis of the assigned reference structures and the respective object distance thereof, whether the wafer was exposed in the optimum exposure geometry, i.e. for example at the optimum focus.

By way of example, a main reference structure can be arranged in the principal plane of an exposure mask, such that for example an optimum exposure geometry is implemented if the reference region of the wafer which is assigned to the main reference structure has the best exposure quality. If a different reference region of the wafer has the best exposure quality, then the exposure geometry can be correspondingly adapted. To that end, by way of example, on the basis of the object distance of the reference structure which is assigned to the reference region of the wafer having the best exposure quality, it is possible to deduce computationally how the wafer must be positioned in order that the main reference structure is imaged with the optimum exposure geometry, i.e. e.g. at the optimum focus.

In accordance with various embodiments, an exposure mask is provided for a projection exposure system or some other suitable exposure system.

In accordance with various embodiments, the exposure mask may include the following: a (for example transparent) carrier; a first exposure structure in a first structure plane of the carrier; and a second exposure structure in a second structure plane of the carrier. The two structure planes differ from one another.

Illustratively, the two structure planes are arranged in each case at different object distances during exposure, such that their exposure structures are imaged in an optimally focused manner in each case at different image distances. It is possible to determine with what degree of focusing or defocusing the exposure structures were imaged, which can serve as a starting point for adapting the exposure geometry.

In accordance with various embodiments, the carrier can have a planar surface, wherein the first structure plane lies parallel to the planar surface. The planar surface of the carrier can define a principal plane, for example, in which further exposure structures (e.g. for producing a product structure on a wafer or other substrate) are arranged which are intended to be optimally imaged during exposure. The first and second exposure structures can serve as reference in order to determine the exposure geometry with which the principal plane is optimally imaged.

In accordance with various embodiments, the second structure plane can lie at an angle to the first structure plane. Illustratively, the exposure structures can be provided on a wedge-shaped section, such that these exposure structures are at different distances from the planar surface of the carrier.

In accordance with various embodiments, the second structure plane can lie parallel to the first structure plane and be spaced apart from the latter. Illustratively, the exposure structures can be provided on a stepped section, such that these exposure structures are at different distances from the planar surface of the carrier.

In this case, the distance between the second structure plane and the first structure plane can be greater than approximately 250 nm, e.g. greater than approximately 500 nm. In accordance with various embodiments, the distance between two directly adjacent structure planes can be greater than approximately 250 nm, e.g. greater than approximately 500 nm.

In accordance with various embodiments, the wedge-shaped or stepped section can be provided in the carrier or on the carrier. By way of example, such a structure can be etched into the carrier or placed onto the carrier.

In accordance with various embodiments, the first exposure structure may include a first focus-sensitive test pattern (e.g. a line pattern, a pattern of holes or rhombi or the like). The second exposure structure may include a second focus-sensitive test pattern, wherein the two focus-sensitive test patterns can be identical. The imaging quality of the two focus-sensitive test patterns on the substrate can thus be compared with one another.

In accordance with various embodiments, the carrier can be transparent; by way of example, the carrier may include or consist of quartz glass. In this case, the exposure structures can be reflective, absorbent or at least less transparent than the carrier. Alternatively, the carrier can be reflective; by way of example, the carrier may include or consist of silicon. In this case, the exposure structures can be absorbent, transparent or at least less reflective than the carrier; by way of example, the exposure structures may include or consist of lead, chromium or gold.

If a transparent carrier is used, the exposure structures may include or consist of a metal, for example chromium, platinum or palladium. Alternatively, a material which is less transparent than the carrier can be used.

In accordance with various embodiments, an exposure apparatus may include the following: a light source; an exposure mask such as is described herein in accordance with various embodiments. The exposure apparatus can be configured in such a way that a substrate (e.g. a wafer or some other suitable substrate) can be exposed by means of the light source and the exposure mask.

The exposure apparatus includes a suitable imaging optical unit for imaging the exposure structures onto the substrate. In this case, the use of the exposure mask has the result that the exposure structures have different object distances (g) during exposure and a focused image of the respective exposure structure is thus generated at different image distances (b).

Illustratively, the imaging optical unit, the wafer and the exposure mask are arranged relative to one another in such a way that the system can essentially be described by paraxial optics. Moreover, further effects can be analogously included in the consideration.

In accordance with various embodiments, the exposure apparatus may include a positioning arrangement for positioning the substrate relative to the light source, to the exposure mask and to the imaging optical unit, such that the exposure structures are imaged onto the substrate during exposure.

In accordance with various embodiments, the positioning arrangement can be designed in such a way that a distance between the substrate and the imaging optical unit corresponding to the image distance of the first exposure structure is set, such that the first exposure structure is imaged onto the substrate in a focused manner and that the second exposure structure is imaged onto the substrate in a defocused manner. Illustratively, the first exposure structure can be arranged in the principal plane of the exposure mask, such that, if the first exposure structure is imaged optimally (e.g. at the optimum focus), the entire exposure mask is imaged optimally.

In accordance with various embodiments, an exposure mask may include the following: a (for example transparent) carrier; an exposure structure (e.g. a product exposure structure) arranged in a principal plane of the carrier; a plurality of reference exposure structures. At least one first reference exposure structure of the reference exposure structures is arranged in the principal plane. At least one second reference exposure structure of the reference exposure structures is arranged at a distance from the principal plane.

In accordance with various embodiments, the carrier can have a planar surface, which defines the principal plane.

In accordance with various embodiments, the second reference exposure structure can be arranged below the principal plane in the carrier. Alternatively, the second reference exposure structure can be arranged above the principal plane on the carrier.

In accordance with various embodiments, the plurality of reference exposure structures can be at least partly identical. By way of example, each of the plurality of reference exposure structures may include a line pattern having a predefined line width and/or a predefined line spacing. Furthermore, each of the plurality of reference exposure structures may include a trench pattern having a predefined trench width and/or a predefined trench spacing. Furthermore, each of the plurality of reference exposure structures may include a pattern of holes having a predefined diameter of the holes and/or a predefined spatial distribution of the holes. Furthermore, each of the plurality of reference exposure structures may include a pattern of rhombi having a predefined size of the rhombi and/or a predefined spatial distribution of the rhombi.

In accordance with various embodiments, a method for calibrating an exposure apparatus may include the following: exposing a light-sensitive layer by means of an exposure mask such as is described herein in accordance with various embodiments in a predefined exposure geometry. The exposure structure and the respective reference exposure structures are imaged on the light-sensitive layer; developing the exposed layer. A first reference structure is formed with a first structure accuracy on the basis of the imaging of the first reference exposure structure and a second reference structure is formed with a second structure accuracy on the basis of the imaging of the second reference exposure structure. The method may further include adapting or changing the exposure geometry if the first structure accuracy is lower than the second structure accuracy. In this case, the adapting can be carried out for example in such a way that the first structure accuracy is improved or increased upon renewed exposure with the changed exposure geometry.

In accordance with various embodiments, the structure accuracy can be determined by a focus-sensitive pattern (also referred to as focus-sensitive reference pattern, focus-sensitive test pattern or reference exposure structure) being imaged onto a light-sensitive layer and the light-sensitive layer subsequently being developed, wherein a structure is produced in the light-sensitive layer in accordance with the focus-sensitive pattern. The structure accuracy can be the highest or optimum if for example a line structure produced has the widest lines, or if a hole or trench structure has the narrowest openings, that is to say if the focus-sensitive pattern is imaged with the best possible contrast, for example if the structure width produced assumes an extremum. Illustratively, line structures produced by means of a line pattern become narrower if the exposure is not effected at the optimum focus. The optimum focus can thus be determined on the basis of the line width of the line structure.

In accordance with various embodiments, a method for calibrating an exposure apparatus may include the following: exposing a light-sensitive layer by means of an exposure mask such as is described herein in accordance with various embodiments in a predefined exposure geometry, wherein the exposure structure and the respective reference exposure structures are imaged on the light-sensitive layer; developing the exposed layer, wherein a first reference structure is formed with a first structure accuracy on the basis of the imaging of the first reference exposure structure and a second reference structure is formed with a second structure accuracy on the basis of the imaging of the second reference exposure structure; determining whether the first structure accuracy is lower than the second structure accuracy; and adapting the exposure geometry if the first structure accuracy is lower than the second structure accuracy in such a way that the first structure accuracy is increased upon renewed exposure with the changed exposure geometry.

In accordance with various embodiments, the exposure structure and the reference exposure structures can be imaged on the light-sensitive layer by means of only one exposure process.

Furthermore, the method may include the following: exposing a further light-sensitive layer with the adapted exposure geometry. The light-sensitive layer can be arranged on a wafer, for example, wherein the further light-sensitive layer can be arranged on a further wafer, e.g. a wafer from the next batch.

In accordance with various embodiments, a method for calibrating an exposure apparatus may include the following: exposing a light-sensitive layer by means of an exposure mask in a predefined exposure geometry, wherein the exposure structure and the reference exposure structures are imaged on the light-sensitive layer; developing the exposed layer, wherein a first reference structure is formed with a first structure width on the basis of the imaging of the first reference exposure structure and a second reference structure is formed with a second structure width on the basis of the imaging of the second reference exposure structure; determining whether the first structure width differs from the second structure width; and adapting the exposure geometry if the first structure width differs from the second structure width. In this case, the exposure structure and the reference exposure structures can be imaged on the light-sensitive layer by means of only one exposure process. The reference exposure structures can be or include focus-sensitive test patterns.

In accordance with various embodiments, adapting the exposure geometry can also be optional; by way of example, the information about the quality of the exposure can suffice to instigate further steps, e.g. to change the process control or to sort out defective components.

In accordance with various embodiments, the wafer can be exposed in an unused chip region or chip region provided separately for this purpose or in the kerf (i.e. in the sawing frame between the product chips) by means of the reference structures, such that it is possible to obtain information about the quality of the exposure, e.g. about the focus, in addition to the conventional wafer processing (e.g. the formation of electronic components).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A lithographic mask, comprising:
a carrier;
a first lithographic exposure structure in a first structure plane of the carrier; and
a second lithographic exposure structure in a second structure plane of the carrier;
wherein the first structure plane differs from the second structure plane, and
wherein the first lithographic exposure structure comprises a first focus-sensitive pattern and wherein the second lithographic exposure structure comprises a second focus-sensitive pattern, wherein the first focus-sensitive pattern and the second focus-sensitive pattern are identical.

2. The lithographic mask of claim 1,
wherein the carrier comprises a planar surface and wherein the first structure plane lies parallel to the planar surface.

3. The lithographic mask of claim 1,
wherein the second structure plane lies at an angle to the first structure plane.

4. The lithographic mask of claim 1,
wherein the second structure plane lies parallel to the first structure plane and is spaced apart from the first structure plane.

5. The lithographic mask of claim 4,
wherein a distance between the second structure plane and the first structure plane is greater than 250 nm.

6. The lithographic mask of claim 1,
wherein the carrier is optically transparent and wherein the lithographic exposure structures are at least one of optically reflective or optically absorbent.

7. The lithographic mask of claim 1,
wherein the carrier is optically reflective and wherein the lithographic exposure structures are at least one of optically absorbent or optically transparent.

8. An exposure apparatus, comprising:
a light source;
an exposure mask, comprising:
a carrier;
a first exposure structure in a first structure plane of the carrier; and
a second exposure structure in a second structure plane of the carrier;
wherein the first structure plane differs from the second structure plane;
wherein the exposure apparatus is configured in such a way that a substrate can be exposed by means of the light source and the exposure mask; and
wherein the exposure apparatus comprises an imaging optical unit configured to image the exposure structures onto the substrate and is configured in such a way that the exposure structures have different object distances and a focused image of the respective exposure structure is thus generated at different image distances.

9. The exposure apparatus of claim 8,
wherein the exposure apparatus comprises a positioning arrangement for positioning the substrate relative to the imaging optical unit in such a way that the exposure structures are imaged onto the substrate during exposure.

10. The exposure apparatus of claim 9,
wherein the positioning arrangement is configured in such a way that a distance between the substrate and the imaging optical unit corresponding to the image distance for the first exposure structure is set during exposure.

11. An exposure mask, comprising:
a carrier;
an exposure structure arranged in a principal plane of the carrier;
a plurality of reference exposure structures, wherein at least one first reference exposure structure of the reference exposure structures is arranged in the principal plane, wherein at least one second reference exposure structure of the reference exposure structures is arranged at a distance from the principal plane below the principal plane in the carrier, and wherein at least one third reference exposure structure of the reference exposure structures is arranged at a distance from the principal plane above the principal plane on the carrier.

12. The exposure mask of claim 11,
wherein the carrier comprises a planar surface, which defines the principal plane.

13. The exposure mask of claim 11,
wherein the plurality of reference exposure structures are at least partly identical and are embodied in such a way that these are focus-sensitive.

14. The exposure mask of claim 11,
wherein the carrier is optically transparent and wherein the exposure structures are at least one of optically reflective or optically absorbent; or
wherein the carrier is optically reflective and wherein the exposure structures are at least one of optically absorbent or optically transparent.

15. A method for calibrating an exposure apparatus, the method comprising:
exposing a light-sensitive layer by means of an exposure mask in a predefined exposure geometry, the exposure mask comprising:
a carrier;
an exposure structure arranged in a principal plane of the carrier;
a plurality of reference exposure structures, wherein at least one first reference exposure structure of the reference exposure structures is arranged in the principal plane and wherein at least one second reference exposure structure of the reference exposure structures is arranged at a distance from the principal plane, wherein the exposure structure and the respective reference exposure structures are imaged on the light-sensitive layer;
developing the exposed layer, wherein a first reference structure is formed with a first structure accuracy on the basis of the imaging of the first reference exposure structure and a second reference structure is formed with a second structure accuracy on the basis of the imaging of the second reference exposure structure; and
adapting the exposure geometry if the first structure accuracy is lower than the second structure accuracy.

16. The method of claim 15,
wherein the exposure structure and the reference exposure structures are imaged on the light-sensitive layer by only one exposure process.

17. The method of claim 15, further comprising:
exposing a further light-sensitive layer with the adapted exposure geometry.

* * * * *